(12) United States Patent
Kim (10) Patent No.: US 10,424,567 B2
(45) Date of Patent: Sep. 24, 2019

(54) DISPLAY APPARATUS AND METHOD OF MANUFACTURING THE SAME

(71) Applicant: Samsung Display Co., Ltd., Yongin-si, Gyeonggi-do (KR)

(72) Inventor: Mugyeom Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 41 days.

(21) Appl. No.: 15/492,058

(22) Filed: Apr. 20, 2017

(65) Prior Publication Data

US 2017/0309604 A1 Oct. 26, 2017

(30) Foreign Application Priority Data

Apr. 20, 2016 (KR) .................. 10-2016-0048165

(51) Int. Cl.

| | | |
|---|---|---|
| *H01L 25/16* | (2006.01) | |
| *H01L 33/60* | (2010.01) | |
| *H01L 25/075* | (2006.01) | |
| *H01L 27/12* | (2006.01) | |
| *H01L 27/28* | (2006.01) | |
| *H01L 33/62* | (2010.01) | |

(52) U.S. Cl.
CPC ............ *H01L 25/167* (2013.01); *H01L 33/60* (2013.01); *H01L 25/0753* (2013.01); *H01L 27/1225* (2013.01); *H01L 27/283* (2013.01); *H01L 33/62* (2013.01); *H01L 2933/0058* (2013.01); *H01L 2933/0066* (2013.01)

(58) Field of Classification Search
CPC ... H01L 25/167; H01L 25/0753; H01L 33/60; H01L 33/62; H01L 27/1225; H01L 27/283; H01L 2933/0058; H01L 2933/0066
See application file for complete search history.

(56) References Cited

U.S. PATENT DOCUMENTS

| | | | |
|---|---|---|---|
| 8,506,867 B2 | 8/2013 | Menard | |
| 2008/0111484 A1* | 5/2008 | Kwon | ................. H01L 27/3248 313/506 |
| 2012/0046187 A1 | 2/2012 | Baba et al. | |
| 2013/0257808 A1* | 10/2013 | Chen | ...................... G06F 3/042 345/175 |

FOREIGN PATENT DOCUMENTS

| | | |
|---|---|---|
| JP | 2011198697 A | 10/2011 |
| KR | 1020110132344 A | 12/2011 |

* cited by examiner

*Primary Examiner* — Timor Karimy
(74) *Attorney, Agent, or Firm* — Cantor Colburn LLP (57) ABSTRACT

A display apparatus includes: an emission layer including a light-emitting element which generates and emits light; a driving layer which drives the light-emitting element of the emission layer to generate and emit the light; and an adhesive layer which connects the light-emitting element to the driving layer. The driving layer includes: a substrate; and a conductive layer on the substrate and connected to the light-emitting element of the emission layer by the adhesive layer. The emission layer includes: a bank layer on the conductive layer of the driving layer, and an opening in the bank layer which exposes a portion of the conductive layer of the driving layer. The adhesive layer is disposed between the exposed portion of the conductive layer and the light-emitting element, and extends therefrom to be disposed on inner surfaces of the bank layer at the opening.

12 Claims, 4 Drawing Sheets

DISPLAY APPARATUS AND METHOD OF MANUFACTURING THE SAME

This application claims priority to Korean Patent Application No. 10-2016-0048165, filed on Apr. 20, 2016, and all the benefits accruing therefrom under 35 U.S.C. § 119, the contents of which in their entirety are herein incorporated by reference.

BACKGROUND

1. Field

One or more exemplary embodiments relate to a display apparatus and a method of manufacturing the display apparatus.

2. Description of the Related Art

Light-emitting diodes ("LEDs") convert electrical signals into light such as infrared light or visible light according to the characteristics of compound semiconductors within the LEDs. LEDs are used in home appliances, remote controllers, electric boards, and various automatic devices. LEDs are also widely used in various electronic devices ranging from small hand-held electronic devices to large display apparatuses. Applications of LEDs are constantly increasing.

SUMMARY

Provided are a display apparatus and a method of manufacturing the display apparatus.

According to one or more embodiments, a display apparatus includes: an emission layer including a light-emitting element which generates and emits light; a driving layer which drives the light-emitting element of the emission layer to generate and emit the light; and an adhesive layer which connects the light-emitting element to the driving layer. The driving layer includes: a substrate; and a conductive layer on the substrate and connected to the light-emitting element of the emission layer by the adhesive layer. The emission layer includes: a bank layer on the conductive layer of the driving layer, and an opening in the bank layer which exposes a portion of the conductive layer of the driving layer. The adhesive layer is disposed between the exposed portion of the conductive layer and the light-emitting element, the adhesive layer extending from between the exposed portion of the conductive layer and the light-emitting element to be disposed on inner surfaces of the bank layer at the opening.

The adhesive layer may include a metal material.

The adhesive layer may include at least one of silver (Ag), magnesium (Mg), aluminum (Al) and copper (Cu).

The light-emitting element may include an electrode pad electrically connected to the conductive layer.

The adhesive layer may include a reflection material which reflects light.

According to one or more embodiments, a method of manufacturing a display apparatus includes: forming a conductive layer of a driving layer of the display apparatus which drives an emission layer thereof, on a substrate; forming a bank layer of the emission layer, on the conductive layer of the driving layer, the bank layer including an opening exposing a portion of the conductive layer of the driving layer; applying an adhesive material through the opening in the bank layer and onto the exposed portion of the conductive layer at the opening; disposing a light-emitting element of the emission layer, on the adhesive layer which is disposed on the exposed portion of the conductive layer; and curing the adhesive layer which is disposed on the exposed portion of the conductive layer to form an adhesive layer between the exposed portion of the conductive layer of the driving layer and the light-emitting element of the emission layer.

The adhesive material may include a metal material and a solvent.

The metal material may include at least one of silver (Ag), magnesium (Mg), aluminum (Al) and copper (Cu).

In the applying of the adhesive material, the adhesive material may have affinity with a material of the bank layer such that the adhesive material applied onto the exposed portion of the conductive layer at the opening flows from the exposed portion of the conductive layer to inner surfaces of the bank layer at the opening. In the curing the adhesive material, the adhesive material which is disposed on the exposed portion of the conductive layer and extended to the inner surfaces of the bank layer may form the adhesive layer between the conductive layer of the driving layer and the light-emitting element of the emission layer and extended to the inner surfaces of the bank layer.

The disposing of the light-emitting element includes contacting an electrode pad of the light-emitting element with the adhesive material which is disposed on the exposed portion of the conductive layer.

According to one or more embodiments, a display apparatus includes: an emission layer including a light-emitting element which generates and emits light; a driving layer which drives the light-emitting element of the emission layer to generate and emit the light; and an adhesive layer which connects the light-emitting element to the driving layer. The driving layer includes: a substrate; and a conductive layer on the substrate and connected to the light-emitting element of the emission layer by the adhesive layer. The emission layer includes: a bank layer on the conductive layer of the driving layer, an opening in the bank layer which exposes a portion of the conductive layer of the driving layer and in which the light-emitting element is disposed, and a reflective layer surrounding side surfaces of the light-emitting element disposed in the opening of the bank layer. The adhesive layer is disposed between the exposed portion of the conductive layer and the light-emitting element.

The reflective layer may include an insulating material.

The reflective layer may include at least one of silicon (Si), zirconium (Zr), hafnium (Hf), titanium (Ti), and aluminum (Al).

The adhesive layer may include a metal material.

The adhesive layer may include at least one of silver (Ag), magnesium (Mg), aluminum (Al), and copper (Cu).

The light-emitting element may include an electrode pad electrically connected to the conductive layer.

The adhesive layer may be spaced apart from inner surfaces of the bank layer at the opening.

BRIEF DESCRIPTION OF THE DRAWINGS

These and/or other features will become apparent and more readily appreciated from the following description of the exemplary embodiments, taken in conjunction with the accompanying drawings in which.

DETAILED DESCRIPTION

As the disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of related art are omitted when it is deemed that they may unnecessarily obscure the essence of the disclosure.

While such terms as "first," "second," etc., may be used to describe various components, such components must not be limited to the above terms. The above terms are used only to distinguish one component from another.

All examples and conditional language recited herein are to be construed as being without limitation to such specifically recited examples and conditions. Throughout the specification, a singular form may include plural forms, unless there is a particular description contrary thereto. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, some elements may be exaggerated, omitted, or roughly illustrated, and the size of each element does not exactly correspond to an actual size of each element.

Throughout the specification, it will also be understood that when an element is referred to as being on or over or below or under another element, it can be directly on or over or below or under the other element, or intervening elements may also be present. In contrast, when an element is referred to as being "directly" on or over or below or under another element, no intervening elements are present. As used herein, the term "connected" may refer to a physical and/or electrical connection.

In addition, relative terms such as "over" or "under" may be used to describe relationship between elements as illustrated in the drawings. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Reference will now be made in detail to embodiments, examples of which are illustrated in the accompanying drawings, wherein like reference numerals refer to like elements throughout and redundant descriptions thereof are not provided here.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
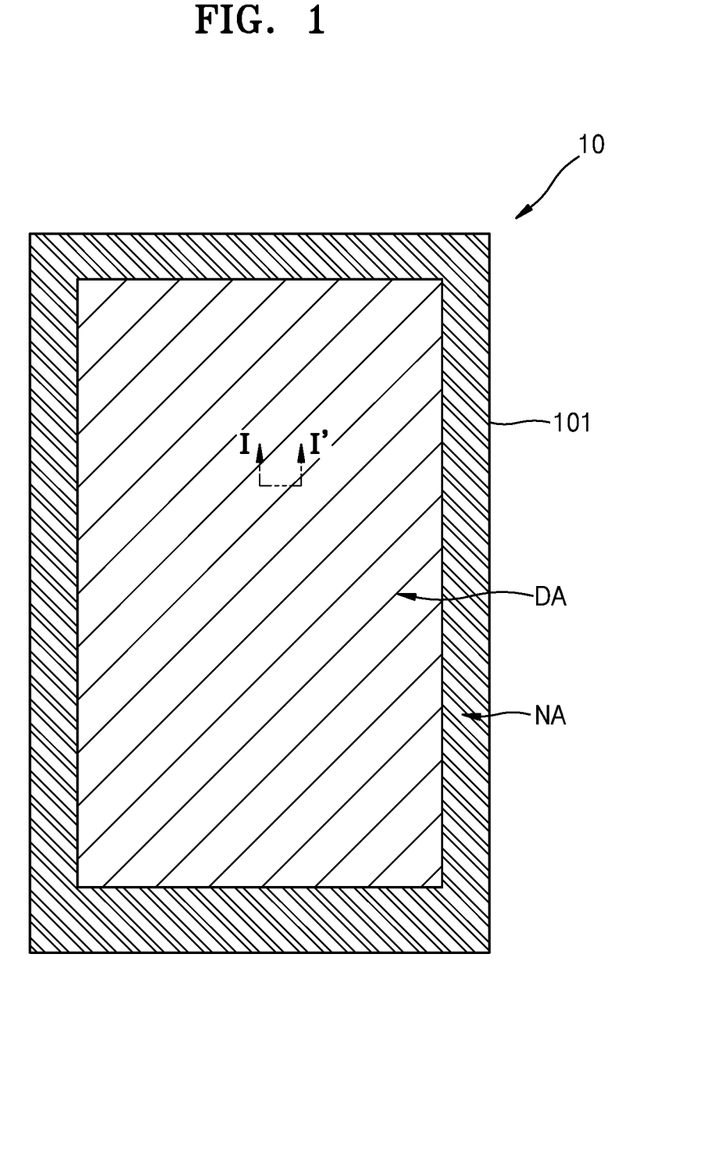
FIG. 1 is a top plan view of an exemplary embodiment of a display apparatus according to the invention.
Figure 2:
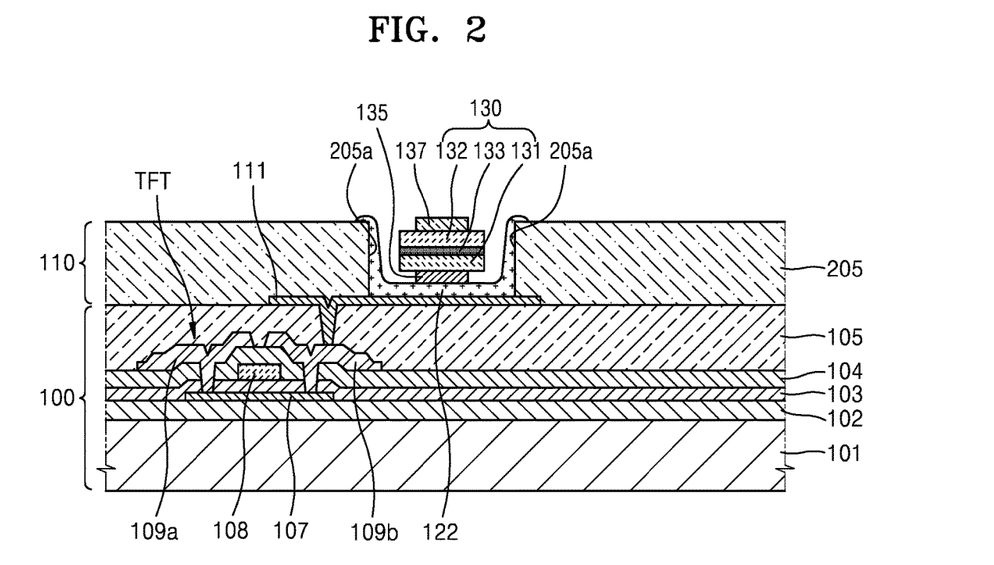
FIG. 2 is a cross-sectional view of a display area of the display apparatus taken along line I-I' of FIG. 1 according to the invention.

FIG. 1 is a top plan view of an exemplary embodiment of a display apparatus 10, according to the invention. FIG. 2 is a cross-sectional view of a display area of the display apparatus 10 taken along line I-I' of FIG. 1.

Referring to FIGS. 1 and 2, the display apparatus 10 according to the illustrated embodiment may include a (base) substrate 101, a thin-film transistor TFT, a pixel electrode 111, a bank layer 205, a light-emitting element such as a light-emitting diode ("LED") 130 and an adhesive layer 122. In another embodiment, the display apparatus 10 may not include the thin-film transistor TFT. The display apparatus 10 collectively includes an emission layer 110 on a driving (or switching) layer 100 which drives the emission layer 110, particularly the LED 130, to generate and emit light. The display apparatus 10 and the base substrate 101 may be disposed in a plane defined by first and second directions crossing each other. Referring to FIG. 1, for example, the display apparatus 10 may have a relatively long side lengthwise extended in a first (e.g., vertical in FIG. 1) direction and a relatively short side lengthwise extended in a second (e.g., horizontal in FIG. 1) direction.

A display area DA at which an image is generated and displayed and a non-display area NA at which the image is not generated or displayed may be defined on the substrate 101. The non-display area NA may be defined in a periphery of the display area DA. The LED 130 may be placed in the display area DA, and a power line, etc., may be placed in the non-display area NA. The thin-film transistor TFT, the pixel electrode 111, the light-emitting diode (LED) 130 and the adhesive layer 122 may be provided in plurality within the display area DA.

The substrate 101 may include any of various materials. In an exemplary embodiment, for example, the substrate 101 may include a glass material having $SiO_2$ as a main component. However, the substrate 101 is not limited thereto, and may include a plastic material and may be flexible. The plastic material may be an insulating organic material including at least one of polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide, polycarbonate ("PC"), cellulose triacetate ("TAC"), and cellulose acetate propionate ("CAP"). In another embodiment, the substrate 101 may include a transparent material.

Within the driving layer 100, a buffer layer 102 may be on the substrate 101. The buffer layer 102 may planarize a top surface of the substrate 101 and may reduce or effectively prevent impurities or moisture from penetrating into the substrate 101. In an exemplary embodiment, for example, the buffer layer 102 may include an inorganic material such as silicon oxide, silicon nitride, silicon oxynitride, aluminum oxide, aluminum nitride, titanium oxide or titanium nitride or an organic material such as polyimide, polyester or acryl. The overall buffer layer 102 may be formed as a stack of layers including a plurality of the above-described materials.

Within the driving layer 100, the thin-film transistor TFT disposed in the display area DA may collectively include an active layer 107, a gate electrode 108, a source electrode 109a and a drain electrode 109b. The thin-film transistor TFT is driven to in turn drive the emission layer 110 to generate and display the image within the display area DA.

Hereinafter, a top gate type thin-film transistor TFT in which the active layer 107, the gate electrode 108, the source electrode 109a and the drain electrode 109b are sequentially disposed or formed in order from the substrate 101 is described. However, the invention is not limited thereto, and one of various thin-film transistors TFT including a bottom gate type thin-film transistor TFT may be employed.

The active layer 107 may be on (e.g., above) the buffer layer 102 in the cross-sectional (e.g., thickness) direction of the display apparatus 10. The thickness direction may be perpendicular to both the first and second directions described above.

The active layer 107 may include a semiconductor material, for example, amorphous silicon or polycrystalline silicon. However, the invention is not limited thereto, and the active layer 107 may include various materials. According to another embodiment, the active layer 107 may include an organic semiconductor material.

According to another embodiment, the active layer 107 may include an oxide semiconductor material. In an exemplary embodiment, for example, the active layer 107 may include an oxide of a material including at least one of the Groups 12, 13 and 14 metal elements such as zinc (Zn), indium (In), gallium (Ga), tin (Sn), cadmium (Cd), germanium (Ge), etc., or a combination thereof.

Within the driving layer 100, a gate insulating layer 103 may be on the active layer 107. The gate insulating layer 103 insulates the active layer 107 from the gate electrode 108. The gate insulating layer 103 may be disposed or formed as a single layer or a multi-stack layer including an inorganic material such as a silicon oxide and/or a silicon nitride.

The gate electrode 108 may be on the gate insulating layer 103. The gate electrode 108 may be connected to a gate line (not shown) within the display area DA and through which an on-signal or an off-signal is applied to the thin-film transistor TFT in the display area DA.

The gate electrode 108 may be disposed or formed as a single layer or a multi-stack layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium(Ti), tungsten (W) and copper (Cu), in consideration of adhesion of the gate electrode 108 to an adjacent layer, planarization of a surface of a stack-target layer, formability, or the like.

Within the driving layer 100, an interlayer insulating layer 104 may be on the gate electrode 108. The interlayer insulating layer 104 insulates the gate electrode 108 from the source electrode 109a and the drain electrode 109b. The interlayer insulating layer 104 may be disposed or formed as a single layer or a multi-stack layer including an inorganic material. In an exemplary embodiment, for example, the inorganic material may be metal oxide or metal nitride. In more detail, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$) or zirconium oxide ($ZrO_2$).

Within the thin-film transistor TFT, the source electrode 109a and the drain electrode 109b may be on the interlayer insulating layer 104. The source electrode 109a and the drain electrode 109b may each be disposed or formed as a single layer or a multi-stack layer including at least one of Al, Pt, Pd, Ag, Mg, Au, Ni, Nd, Ir, Cr, Li, Ca, Mo, Ti, W and Cu. The source electrode 109a and the drain electrode 109b may be spaced apart from each other relative to the gate electrode 108 and each contact an area of the underlying active layer 107.

Within the driving layer 100, a planarization layer 105 may be over the thin-film transistor TFT. The planarization layer 105 may be disposed or formed as a single layer or a multi-stack layer including an organic material. The organic material may include commercial polymers such as polymethylmethacrylate ("PMMA") or polystylene ("PS"), polymer derivatives having a phenol group, an acryl-based polymer, an imide-based polymer, an arylene ether-based polymer, an amide-based polymer, a fluorine-based polymer, a p-xylene-based polymer, a vinylalcohol-based polymer or a combination thereof. Alternatively, the planarization layer 105 may be disposed formed as a multi-stack including an inorganic insulating layer and an organic insulating layer.

The planarization layer 105 may cover the thin-film transistor TFT. By covering the thin-film transistor TFT, the planarization layer 105 may compensate a step difference due to layers within the thin-film transistor TFT, may planarize underlying layers to provide a flat top surface, and may reduce or effectively prevent occurrence of a defect in the overlying emission layer 110 due to unevenness.

Within the driving layer 100, the pixel electrode 111 may be on the planarization layer 105. The pixel electrode 111 may be electrically connected to the thin-film transistor TFT. In more detail, the pixel electrode 111 may be electrically connected to the drain electrode 109b at and through a contact hole formed in the planarization layer 105. The pixel electrode 111 may have one of various forms, and for example, the pixel electrode 111 may be patterned to have an island form (e.g., discrete-shaped element in the top plan view). The pixel electrode 111 may receive a signal provided from the driven thin-film transistor TFT to participate in generating and displaying the image which is displayed in the display area DA.

Referring to FIG. 2, a top emission-type display provides the generated image in an upper direction, that is, a direction from the substrate 101 to the bank layer 205. When the display apparatus 10 is a top emission-type display apparatus, the pixel electrode 111 may include a reflective layer including Ag, Mg, Al, Pt, Pd, Au, Ni, Nd, Ir, Cr or a combination thereof, and a transparent or translucent electrode layer which is on the reflective layer. The transparent or translucent electrode layer may include at least one of indium tin oxide ("ITO"), indium zinc oxide ("IZO"), zinc oxide (ZnO), indium oxide ($In_2O_3$), indium gallium oxide ("IGO") and aluminum zinc oxide (AZO).

Referring to FIG. 2, a bottom emission-type display provides the generated image in a downward direction, that is, a direction from the bank layer 205 to the substrate 101. When the display apparatus 10 is a bottom emission-type display apparatus, the pixel electrode 111 may be disposed or formed as a transparent or translucent electrode. Hereinafter, a conductive layer may form a portion of the pixel electrode 111 included in the display apparatus 10 which includes the thin-film transistor TFT, or may be formed from a material included in the display apparatus 10 which does not include the thin-film transistor TFT.

Within the emission layer 110, the bank layer 205 may be on the planarization layer 105. The bank layer 205 may cover edges of the pixel electrode 111 so as to allow at least a portion of the pixel electrode 111 to be exposed through an opening 205a defined in the bank layer 205. In an exemplary embodiment, the bank layer 205 may expose an entire portion of the pixel electrode 111 through the opening 205a. In an exemplary embodiment, for example, the bank layer 205 may include elastomeric silicone, elastomeric polyurethane, elastomeric polyisoprene or the like.

Within the emission layer 110, the LED 130 may emit red light, green light or blue light, and may realize white light by using a fluorescent material therein or by combining light of different colors. The LED 130 may include a first semiconductor layer 131, a second semiconductor layer 132 and an intermediate layer 133 which is between the first semiconductor layer 131 and the second semiconductor layer 132.

The first semiconductor layer 131 may be a p-type semiconductor layer. The p-type semiconductor layer may include at least one semiconductor material, such as GaN, AlN, AlGaN, InGaN, InN, InAlGaN, AlInN, etc., represented by the formula $In_xAl_yGa1-x-yN$ ($0 \le x \le 1$, $0 \le y \le 1$, $0 \le x+y \le 1$). The p-type semiconductor layer may be doped with a p-type dopant such as Mg, Zn, Ca, Sr, Ba or the like.

The second semiconductor layer 132 may include an n-type semiconductor layer. The n-type semiconductor layer may include at least one of semiconductor materials such as GaN, AlN, AlGaN, InGaN, InN, InAlGaN, AlInN, etc., each being represented by the formula $In_xAl_yGa1-x-yN$ ($0 \le x \le 1$, $0 \le y \le 1$, $0 \le x+y \le 1$), and may be doped with an n-type dopant such as Si, Ge, Sn or the like.

However, the invention is not limited thereto, and the first semiconductor layer 131 may include the n-type semiconductor layer, and the second semiconductor layer 132 may include the p-type semiconductor layer.

The intermediate layer 133 is a region where electrons and holes are recombined. Due to the recombination of the electrons and holes within the intermediate layer 133, an energy level transitions from a high energy level to a low energy level, and thus, the intermediate layer 133 may generate light having a wavelength corresponding to the energy level transition. The intermediate layer 133 may include a semiconductor material represented by the formula $In_xAl_yGa1-x-yN$ ($0 \le x \le 1$, $0 \le y \le 1$, $0 \le x+y \le 1$), and may have a single quantum well structure or a multi-quantum well ("MQW") structure. According to another exemplary embodiment, the intermediate layer 133 may have a quantum wire structure or a quantum dot structure.

A first electrode pad 135 may be placed at the first semiconductor layer 131, and a second electrode pad 137 may be placed at the second semiconductor layer 132. That is, the first and second electrode pads 135 and 137 may be at opposing sides of the LED 130 with respect to the intermediate layer 133. The first electrode pad 135 may be electrically connected to the pixel electrode 111 at and through the adhesive layer 122. When the LED 130 has a vertical structure as illustrated in FIG. 2, the second electrode pad 137 may be positioned at a side opposite to that of the first electrode pad 135, and an opposite electrode (not shown) that contacts the second electrode pad 137 may be placed on (e.g., at an upper surface of) the emission layer 110.

The opposite electrode may be placed on an entire portion of the emission layer 110. The opposite electrode may be disposed commonly to a plurality of LEDs disposed in the display area DA, but the invention is not limited thereto.

When the display apparatus 10 is the top emission-type display apparatus, the opposite electrode may be a transparent or translucent electrode, and may include or be formed as a metal thin film having a relatively small work function and including Li, Ca, LiF/Ca, LiF/Al, Al, Ag, Mg or a combination thereof. In addition, an auxiliary electrode layer or a bus electrode including ITO, IZO, ZnO or $In_2O_3$ included in or used for forming a transparent electrode may be further placed on the metal thin film. Therefore, the opposite electrode may transmit light emitted from the LED 130 in the upper direction for the top emission-type display apparatus. When the display apparatus 10 is a bottom emission-type display apparatus, the opposite electrode may include or be formed as a reflective electrode. In addition, the display apparatus 10 of the illustrated embodiment may be a dual-emission type display apparatus that emits light in both front and rear directions, that is, in upper and downward directions described above.

The adhesive layer 122 may include a conductive material such as a metal material. In an exemplary embodiment, for example, the adhesive layer 122 may include at least one of Ag, Mg, Al and Cu. Therefore, the pixel electrode 111 and the LED 130 may be electrically connected to each other at and through the adhesive layer 122. The adhesive layer 122 includes a reflective material that reflects light, such as at least one of Ag, Mg, Al and Cu or a combination thereof. Alternatively, the adhesive layer 122 may include be formed of a metal material including a relatively small work function and including Ag, Mg, Al, Cu or a combination thereof, and may transmit therethrough a portion of or an entirety of light.

Referring to FIG. 2, the pixel electrode 111 and the first electrode pad 135 are spaced apart from each other by a gap in the thickness direction of the display apparatus 10. The adhesive layer 122 according to the illustrated embodiment may be disposed in the gap between the pixel electrode 111 and the first electrode pad 135 and extend from the gap along the pixel electrode 111 and to inner surfaces or walls of the bank layer 205 at the opening 205a. That is, the adhesive layer 122 may cover a top surface of the pixel electrode 111 which is exposed by the opening 205a, and may cover the inner surfaces of the opening 205a. The adhesive layer 122 extended to the walls of the opening 205a may further extend to be disposed on an upper surface of the bank layer 205.

When the display apparatus 10 is the top emission-type display apparatus, and the adhesive layer 122 has the reflection function that reflects light, light emitted from the LED 130 is reflected by the adhesive layer 122 in the upper direction. Thus, the light emitted from the LED 130 may be reduced or effectively prevented from leaking in a direction other than an opposite direction with respect to the substrate 101 (e.g., the upper direction). Therefore, a quality of an image realized by the display apparatus 10 may be improved.

Figure 3A:
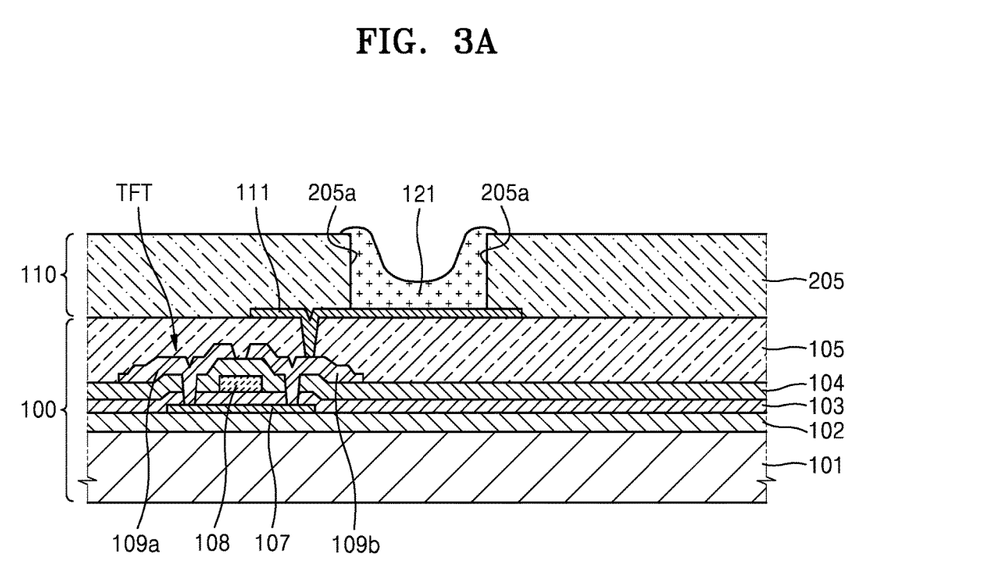
FIGS. 3A and 3B are cross-sectional diagrams for describing an exemplary embodiment of a method of manufacturing a display apparatus according to the invention.
Figure 3B:
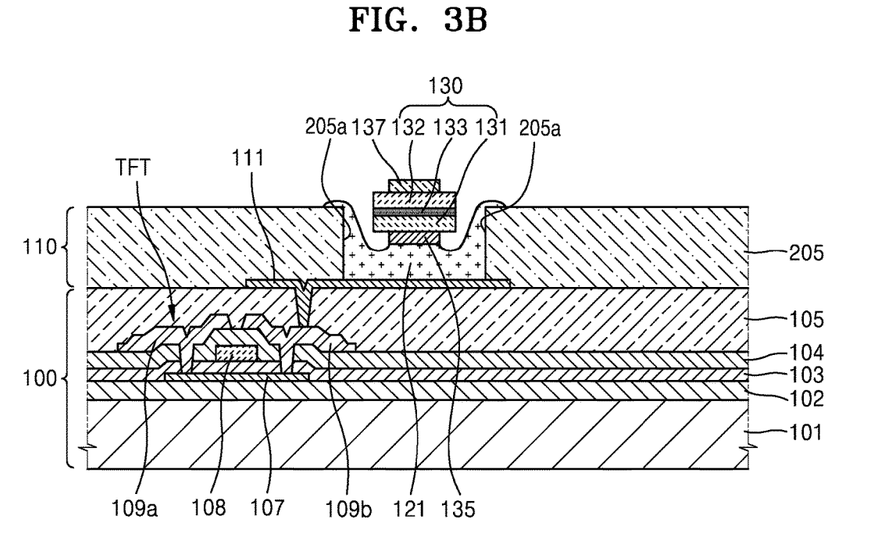

Hereinafter, with reference to FIGS. 3A and 3B, an exemplary embodiment of a method of manufacturing the display apparatus 10 shown in FIG. 2 according to the invention will now be described. FIGS. 3A and 3B may be views taken along line I-I' of FIG. 1.

FIGS. 3A and 3B are diagrams for describing an exemplary embodiment of a method of manufacturing the display apparatus 10 according to the invention.

Referring to FIG. 3A, the driving layer 100 is formed including the substrate 101 and the layers of the driving layer 100 thereon. An adhesive material 121 such as in a liquid form may be applied over the substrate 101 including the layers of the driving layer 100 thereon. The pixel electrode 111 and the bank layer 205 may be disposed on (e.g., over) the substrate 101 including other layers of the driving layer 100 thereon. Alternatively, the thin-film transistor TFT, the pixel electrode 111 and the bank layer 205 may be over the substrate 101.

The adhesive material 121 such as in the liquid form (hereinafter referred to as "liquid adhesive material") may be applied on the pixel electrode 111 that is exposed at and through the opening 205a. The liquid adhesive material 121 may be applied in and over the opening 205a and the upper surface of the bank layer 205 by using one of methods including inkjet printing, screen printing, spray printing, spin coating, slit coating or the like.

The liquid adhesive material 121 may include a conductive material such as a metal material and a solvent which is configured for dissolving the metal material. In an exemplary embodiment, for example, the metal material may include at least one of Ag, Mg, Al and Cu.

The liquid adhesive material 121 according to the illustrated embodiment may have an affinity with the bank layer 205. Therefore, the liquid adhesive material 121 on the pixel electrode 111 may spread toward the bank layer 205, and may cover the inner surfaces of the bank layer 205 at the opening 205a thereof. Accordingly, the liquid adhesive material 121 may be applied in a form where a center of the opening 205a is recessed with respect to an upper surface of the bank layer 205 at outer portions of the opening 205a. Due to flowability of the liquid adhesive material 121 and the recessed shape of the opening 205a, the liquid adhesive material 121 may effectively define a center position of the opening 205a. The liquid adhesive material 121 may be arranged outside the opening 205a, e.g., a top surface of the bank layer 205 which is around the opening 205a to define the opening 205a. The liquid adhesive material 121 in and around the opening 205a is exposed to outside the formed structure.

The LED 130 may be separately formed from the driving layer 100 and the bank layer 205, but the invention is not limited thereto. A plurality of LEDs 130 may be separately provided.

Referring to FIG. 3B, with the liquid adhesive material 121 disposed in the opening 205a of the bank layer 205, the LED 130 may be transferred to be disposed over the substrate 101 including the driving layer 100, the bank layer 205 and the liquid adhesive layer material 121 thereon.

Although not illustrated, in an exemplary embodiment of manufacturing a display apparatus, the LED 130 may be formed on a temporary base substrate (not shown) by using one of methods including metal organic chemical vapor deposition ("MOCVD"), chemical vapor deposition ("CVD"), plasma-enhanced chemical vapor deposition ("PECVD"), molecular beam epitaxy ("MBE"), hydride vapor phase epitaxy ("HVPE") or the like. The LED 130 may be formed in plurality on the temporary base substrate.

The LED 130 formed on the temporary base substrate may be separated from the temporary base substrate, and may be placed or transferred onto a carrier substrate (not shown). In an exemplary embodiment, the plurality of LEDs 130 on the temporary base substrate may be transferred onto one or more carrier substrate.

The one or more LED 130 transferred to the carrier substrate may be separated from the carrier substrate by using a physical method such as a laser lift off ("LLO") method or a chemical method, and the separated LED may be transferred to be disposed over the substrate 101 including the driving layer 100, the bank layer 205 and the liquid adhesive layer material 121 thereon.

In transferring the separated LED 130 to the substrate 101 including the driving layer 100, the bank layer 205 and the liquid adhesive layer material 121 thereon, the LED 130 may be placed on the liquid adhesive material 121. In an exemplary embodiment, for example, the transferring the separated LED 130 to the substrate 101 may dispose the first electrode pad 135 of the LED 130 in contact with the exposed liquid adhesive material 121. Even when the first electrode pad 135 contacts a top surface of the liquid adhesive material 121 at a position away from the center of the opening 205a, the LED 130 may be moved to the center of the opening 205a due to flowability of the liquid adhesive material 121. Therefore, the LED 130 may be exactly transferred to a target position over the substrate 101, for example, to a center of the opening 205a solely to flowability of the liquid adhesive material 121 and without a separate or additional processing step.

Since the first electrode pad 135 of the LED 130, and the metal material and the solvent included in the liquid adhesive material 121 are attracted to each other due to electrical attraction, a plurality of LEDs may be transferred over the substrate 101 at substantially the same time or process and in an electrically uniform manner, regardless of a surface state (e.g., shape or profile of the exposed portion) of the pixel electrode 111.

The solvent is removed from the liquid adhesive material 121 such as through a curing process, so that the adhesive layer 122 (refer to FIG. 2) including the metal material is formed. The removing of the solvent may be performed with the LED 130 disposed on and/or in contact with the liquid adhesive material 121. The curing process may include a thermal curing process which heats the liquid adhesive material 121, and/or an ultraviolet ray curing process which irradiates an ultraviolet ray to the liquid adhesive material 121. The formed adhesive layer 122 (refer to FIG. 2) may have an overall thickness smaller than an original overall thickness of the liquid adhesive material 121 (refer to FIGS. 3A and 3B).

In this manner, according to one or more exemplary embodiment, since the adhesive layer 122 (refer to FIG. 2) is formed between the pixel electrode 111 and the LED 130, contact resistance between the pixel electrode 111 and the LED 130 may be reduced to be improved, and a transfer rate of LEDs 130 to the substrate 101 having the various layers thereon may be improved.

In addition, when the adhesive layer 122 (refer to FIG. 2) has a reflection function that reflects light, the adhesive layer 122 reflects light emitted from the LED 130. Thus, the light emitted from the LED 130 may be reduced or effectively prevented from leaking in a direction other than a target direction.

As a result, a quality of an image realized by the display apparatus 10 may be improved.

Figure 4:
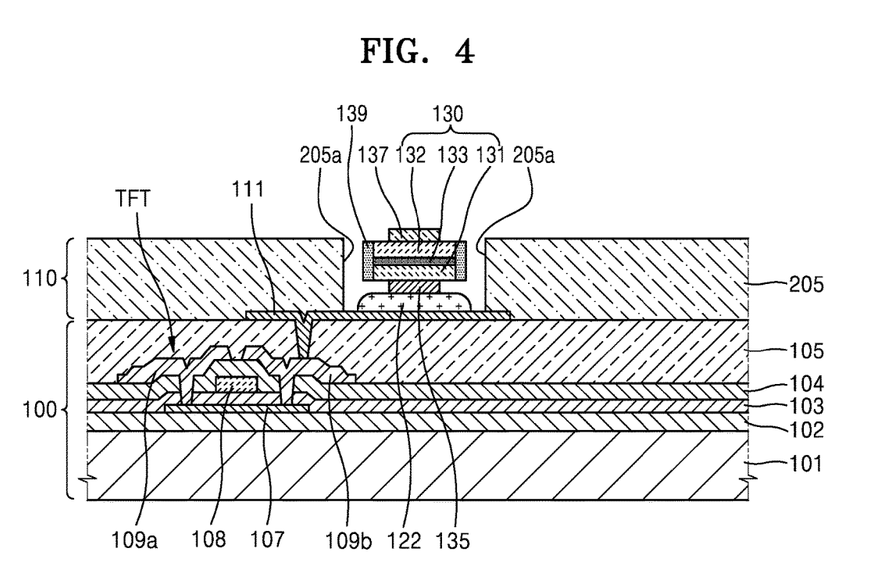
FIG. 4 is a cross-sectional view of another exemplary embodiment of a display area of the display apparatus taken along line I-I' of FIG. 1 according to the invention.

FIG. 4 is a cross-sectional view of another exemplary embodiment of the display apparatus 10, taken along line I-I' of FIG. 1 according to the invention.

Referring to FIG. 4, the display apparatus 10 according to the illustrated embodiment includes the (base) substrate 101, the thin-film transistor TFT, the pixel electrode 111, the bank layer 205, the LED 130 and the adhesive layer 122. The LED 130 may include a reflective layer 139 that surrounds side surfaces of the LED 130. While only two sides of the LED 130 are visible in FIG. 4, in a top plan view of the LED 130, the reflective layer 139 may be disposed at all side surfaces of the LED 130. In another embodiment, the display apparatus 10 may not include the thin-film transistor TFT.

The reflective layer 139 may include an insulating material that performs a reflection function. In an exemplary embodiment, for example, the reflective layer 139 may include, but is not limited to, at least one of silicon (Si), zirconium (Zr), hafnium (Hf), titanium (Ti) and aluminum (Al). Since the reflective layer 139 includes the insulating material, the first semiconductor layer 131, the second semiconductor layer 132 and the intermediate layer 133 that are each surrounded by the reflective layer 139 may be insulated from each other.

According to the illustrated embodiment, the reflective layer 139 that surrounds the LED 130 reflects light generated and emitted from the LED 130. Thus, the light emitted from the LED 130 may be reduced or effectively prevented from leaking in a direction other than a target direction, e.g., an upper direction, a downward direction, both upper and downward directions, etc.

The adhesive layer 122 according to one or more exemplary embodiment may be placed between the pixel electrode 111 and the first electrode pad 135. Edges of the adhesive layer 122 may be spaced apart from inner surfaces or walls of the bank layer 205 at the opening 205a. That is, the adhesive layer 122 may cover at least a portion of a top surface of the pixel electrode 111, where the top surface being exposed by the opening 205a.

An overall reflective member of the display apparatus may be defined by the adhesive layer 122 which reflects light and the reflective layer 139 which also reflects light.

Hereinafter, with reference to FIGS. 5A and 5B, an exemplary embodiment of a method of manufacturing the display apparatus 10 of FIG. 4 will now be described.

Figure 5A:
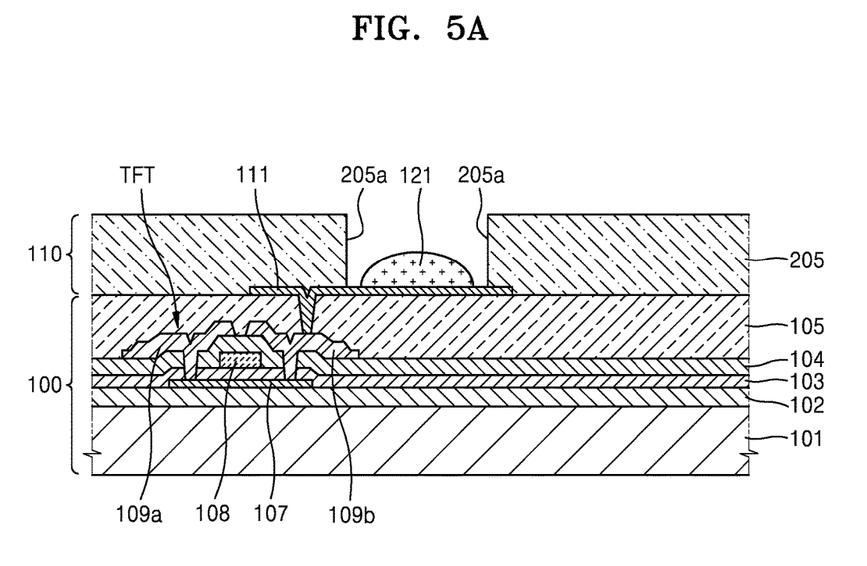
FIGS. 5A and 5B are diagrams for describing another exemplary embodiment of a method of manufacturing a display apparatus according to the invention.
Figure 5B:
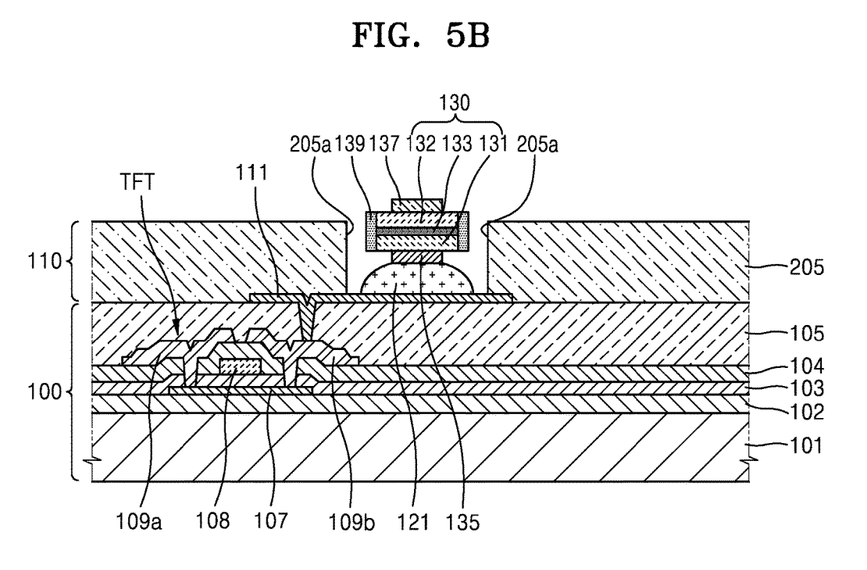

FIGS. 5A and 5B are diagrams for describing another exemplary embodiment of a method of manufacturing the display apparatus 10, according to the invention. FIGS. 5A and 5B may be views taken along line I-I' of FIG. 1.

Referring to FIG. 5A, the driving layer 100 is formed including the substrate 101 and the layers of the driving layer 100 thereon. An adhesive material 121 such as in a liquid form may be applied over the substrate 101 including the layers of the driving layer 100 thereon.

The adhesive material 121 such as in the liquid form (hereinafter referred to as "liquid adhesive material") may be applied on the pixel electrode 111 that is exposed through the opening 205a.

The liquid adhesive material 121 according to the illustrated embodiment may have non-affinity with the bank layer 205. Therefore, the liquid adhesive material 121 on the pixel electrode 111 may be urged in a direction opposite to the bank layer 205. With the liquid adhesive material 121 urged in the direction opposite to the bank layer 205, the liquid adhesive material 121 may be spaced apart from the inner surfaces or walls of the bank layer 205 at the opening 205a such that the liquid adhesive material 121 is formed on at least a portion of a top surface of the pixel electrode 111 to leave a portion of the pixel electrode 111 exposed thereunder. In cross-section, the liquid adhesive material 121 having the non-affinity with the material of the bank layer 205 may have an approximately-convex hemisphere shape in the opening 205a with respect to the substrate 101.

The forming of and the transfer of the formed LED 130 is discussed above with respect to FIGS. 3A and 3B, and repeated description thereof is omitted.

Referring to FIG. 5B, when the LED 130 is transferred to be disposed over the substrate 101, the LED 130 may be placed on the liquid adhesive material 121 exposed at the opening 205a. When the first electrode pad 135 contacts a top surface of the liquid adhesive material 121, the LED 130 may move to the center of the opening 205a due to flowability of the liquid adhesive material 121 which has the non-affinity to the material of the bank layer 205 to be disposed spaced apart from the inner walls of the bank layer 205 at the opening 205a.

Accordingly, the LED 130 may be exactly transferred to a target position over the substrate 101, for example, to a center of the opening 205a solely to flowability of the liquid adhesive material 121 and without a separate or additional processing step. In addition, since the first electrode pad 135 of the LED 130, and the metal material and the solvent included in the liquid adhesive material 121 are attracted to each other due to electrical attraction, a plurality of LEDs may be transferred over the substrate 101 at substantially the same time or process and may have electrical uniformity over a display substrate.

The solvent is removed from the liquid adhesive material 121 such as through a curing process, so that the adhesive layer 122 (refer to FIG. 4) including the metal material may be formed. The removing of the solvent may be performed with the LED 130 disposed on and/or in contact with the liquid adhesive material 121. An overall thickness of the adhesive layer 122 (refer to FIG. 4) may be less than an original overall thickness (refer to FIGS. 5A and 5B) of the liquid adhesive material 121.

In this manner, according to one or more exemplary embodiment, since the adhesive layer 122 (refer to FIG. 4) is formed between the pixel electrode 111 and the LED 130, contact resistance between the pixel electrode 111 and the LED 130 may be reduced to be improved, and a transfer rate of LEDs 130 to the substrate 101 having the various layers thereon may be improved.

Also, when at least the reflective layer 139 (refer to FIG. 4) has a reflection function that reflects light, light emitted from the LED 130 is reflected by the reflective layer 139. Thus, the light emitted from the LED 130 may be reduced or effectively prevented from leaking in a direction other than a target direction. In an exemplary embodiment, both the adhesive layer 122 and the reflective layer 139 has a reflection function to reflect light emitted from the LED 130.

According to one or more embodiment, one or more of an LED may be more exactly transferred to a target position of the display substrate.

In addition, a plurality of transferred LEDs may be transferred to a display substrate having various layers thereon to have electrical uniformity over the display substrate.

In addition, contact resistance between an electrode of a display or switching layer and the LED of an emission layer which is connected to a thin-film transistor of the display layer on a substrate is improved so that a transfer rate of the LED to the display substrate may be improved.

In addition, it is possible to reduce or effectively prevent light generated and emitted from the LED from leaking in a direction other than a target direction, e.g., an upper direction, a downward direction, both upper and downward directions, etc.

Therefore, quality of an image realized by the display apparatus may be improved.

While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:
an emission layer comprising a light-emitting element which generates and emits light;
a driving layer which drives the light-emitting element of the emission layer to generate and emit the light; and
an adhesive layer which connects the light-emitting element to the driving layer,
wherein
the driving layer comprises:
a substrate; and
a conductive layer on the substrate and connected to the light-emitting element of the emission layer by the adhesive layer,
the emission layer comprises:
a bank layer on the conductive layer of the driving layer, and
an opening in the bank layer which exposes a portion of the conductive layer to outside the bank layer, and
within the opening in the bank layer:
the light-emitting element is disposed between side surfaces of the bank layer, and
the adhesive layer is disposed between the portion of the conductive layer and the light-emitting element, the adhesive layer extending from between the portion of the conductive layer and the light-emitting element to be disposed along the side surfaces of the bank layer at the opening.

2. The display apparatus of claim 1, wherein the adhesive layer comprises a metal material.

3. The display apparatus of claim 1, wherein the adhesive layer comprises at least one of silver (Ag), magnesium (Mg), aluminum (Al) and copper (Cu).

4. The display apparatus of claim 1, wherein the light-emitting element of the emission layer comprises an electrode pad electrically connected to the conductive layer of the driving layer.

5. The display apparatus of claim 1, wherein the adhesive layer comprises a reflection material which reflects light.

6. A display apparatus comprising:
an emission layer comprising a light-emitting element which generates and emits light;
a driving layer which drives the light-emitting element of the emission layer to generate and emit the light; and
an adhesive layer which connects the light-emitting element to the driving layer,
wherein
the driving layer comprises:
a substrate; and
a conductive layer on the substrate and connected to the light-emitting element of the emission layer by the adhesive layer,
the emission layer comprises:
a bank layer on the conductive layer of the driving layer,
an opening in the bank layer which exposes a portion of the conductive layer to outside the bank layer and in which the light-emitting element is disposed, and
within the opening in the bank layer:
the light-emitting element disposed in the opening comprises a reflective layer on side surfaces of the light-emitting element, and
the adhesive layer is disposed between the portion of the conductive layer and the light-emitting element and is spaced apart from side surfaces of the bank layer at the opening.

7. The display apparatus of claim 6, wherein the reflective layer comprises an insulating material.

8. The display apparatus of claim 6, wherein the reflective layer comprises at least one of silicon (Si), zirconium (Zr), hafnium (Hf), titanium (Ti) and aluminum (Al).

9. The display apparatus of claim 6, wherein the adhesive layer comprises a metal material.

10. The display apparatus of claim 6, wherein the adhesive layer comprises at least one of silver (Ag), magnesium (Mg), aluminum (Al) and copper (Cu).

11. The display apparatus of claim 6, wherein the light-emitting element of the emission layer comprises an electrode pad electrically connected to the conductive layer of the driving layer.

12. The display apparatus of claim 6, further comprising a reflective member which reflects the light emitted from the light-emitting element,
wherein the reflective member is defined by:
the adhesive layer which is disposed between the portion of the conductive layer and the reflective layer on the light-emitting element and reflects light, and
the reflective layer on the side surfaces of the light-emitting element disposed in the opening of the bank layer.

* * * * *